United States Patent [19]

Babuka et al.

[11] 4,254,431

[45] Mar. 3, 1981

[54] RESTORABLE BACKBOND FOR LSI CHIPS USING LIQUID METAL COATED DENDRITES

[75] Inventors: Robert Babuka, Vestal; Robert E. Heath, Endwell; George J. Saxenmeyer, Jr., Apalachin, all of N.Y.; Lewis K. Schultz, Sayre, Pa.

[73] Assignee: International Business Machines Corporation, Armonk, N.Y.

[21] Appl. No.: 50,390

[22] Filed: Jun. 20, 1979

[51] Int. Cl.$^3$ .................... H01L 25/04; H01L 23/02; H01L 23/48

[52] U.S. Cl. ........................ 357/82; 357/81; 357/66; 357/79; 174/16 HS; 165/80 C

[58] Field of Search ................ 357/81, 66, 82, 79; 174/16 HS; 165/80, 105

[56] References Cited

U.S. PATENT DOCUMENTS

| | | | |
|---|---|---|---|
| 3,226,608 | 12/1965 | Coffin | 357/66 |
| 3,248,615 | 4/1966 | Weisshaar | 357/66 |
| 3,271,638 | 9/1966 | Murad | 357/81 |
| 3,328,642 | 6/1967 | Haumesser et al. | 357/81 |
| 4,129,881 | 12/1978 | Reichei et al. | 357/82 |

OTHER PUBLICATIONS

IBM Technical Disclosure Bulletin, vol. 19, No. 5, Oct. 1976, Inner Fin Air Cooled Module by Cupta, p. 1804.
IBM Technical Disclosure Bulletin, vol. 20, No. 10, Mar. 1978; by Johnson, Device cooling, pp. 3919 & 3920.
IBM Technical Disclosure Bulletin, vol. 21, No. 1, Jun. 1978, by Blake, Packaging Structure, pp. 183 & 184.
IBM Technical Disclosure Bulletin, vol. 16, No. 3, Aug. 1973, by Van Vestrout; Floating Backbond Mounting for a Chip Device.

*Primary Examiner*—Andrew J. James
*Attorney, Agent, or Firm*—Saul A. Seinberg

[57] ABSTRACT

An improved arrangement for cooling a module packaged semiconductor integrated circuit chip having heat generating microcircuits thereon is disclosed. Enhanced cooling over prior art techniques is achieved by utilizing an interfacial layer of liquid metal alloy coated metallic dendrites, which layer is sandwiched between two facing surfaces of the chip and a heat sink. Appropriate biasing means are also provided to urge the dendritic projections into piercing engagement with the liquid metal alloy layer, the biasing means being thermally coupled between the heat sink and the module container to thereby aid in forming unitary heat transfer path from the chip to the module container. The biasing means are adapted to provide sufficient force to cause the dendritic projections to engage and retain the liquid metal alloy layer and to non-destructively force the layer to fill all available space between the chip and the heat sink.

6 Claims, 2 Drawing Figures

4,254,431

RESTORABLE BACKBOND FOR LSI CHIPS USING LIQUID METAL COATED DENDRITES

BACKGROUND OF THE INVENTION

1. Field of the Invention

This invention relates to an arrangement for enhancing thermal conduction to facilitate the removal of heat from a semiconductor chip implemented module and, more particularly, to an arrangement for accomplishing such cooling in a module which employs an interfacial layer of liquid metal alloy coated metallic dendrites.

2. Description of the Prior Art

One of the principal difficulties in the quest toward greater circuit density and higher performance in the large scale integration of bipolar circuits has proven to be the removal of heat from the chips which is generated by the dissipation of electrical energy. Increasing the power dissipation by increasing the circuitry per unit of chip area with no other change implies a proportionate increase in chip operating temperature. This would, unfortunately, result in a reduction of device life according to an exponential, rather than a proportional relationship.

As a consequence, much effort has been devoted to improvement of packaging techniques so that the thermal resistance between a chip and its ambient environment can be lowered. If successful, chip circuit density can be increased without any adverse effect on chip performance and reliability.

One method of packaging LSI chips in a module is shown in the September, 1976 (Vol. 19, No. 4) issue of IBM's Technical Disclosure Bulletin, in an article by B. Clark appearing at page 1336. In this arrangement, the semiconductor chip is connected to conductive lands carried by a ceramic substrate via a plurality of solder balls. The lands, in turn, are connected to pins which extend from the module which is enclosed by a metal cap. Heat transfer from the chip conventionally occurs through the solder balls and the lands to the pins and also from the substrate and chip to the metal cover. In this instance, heat transfer is enhanced by the addition of a peripheral flange that forms a fin for additional heat transfer to the ambient air.

In the April, 1977 (Vol. 19, No. 11) issue of IBM's Technical Disclosure Bulletin, in an article by D. Baldereo et al appearing at pages 4165-6, it is suggested that those substrate lands not used for electrical connection be employed as thermal conductive paths connected directly to the module cap. The article by J. Lynch et al in the June, 1977 (Vol. 20, No. 1) issue of IBM's Technical Disclosure Bulletin appearing at page 143, recommended the addition of a conductive piston which was biased into contact with the chip to provide a substantial heat sink mass and the further use of a solid, low-expansion material, such as molybdenum or beryllium oxide, surrounding the piston and biasing means to enhance its thermal conductivity.

An article by E. Berndlmaier et al which appeared at pages 1772-3 of the October, 1977 (Vol. 20, No. 5) issue of IBM's Technical Disclosure Bulletin presented a different approach to the problem. In this arrangement, the chip was mounted in a sealed cavity within the module, which cavity was bellows-like in construction and included a small amount of liquid metal therein. A stud, extending from the module cap, was located in thermal contact within the bellows to provide a large surface area interface with the liquid metal to promote heat conduction to the cap. The use of a thermal medium, such as a liquid metal, thermal fluid or grease, as an aid in promoting heat transfer from the chip is described in the article by A. Arnold et al which appeared in the December, 1977 (Vol. 20, No. 6) issue of IBM's Technical Disclosure Bulletin at pages 2675-6.

The articles by R. N. Spaight and P. Ginnings et al, which appeared respectively in IBM's Technical Disclosure Bulletin in the December, 1977 (Vol. 20, No. 7) issue at page 2614 and the April, 1979 (Vol. 21, No. 11) issue at page 4493, also described the use of a formable thermal transfer medium to enhance heat dissipation from a chip module.

The use of dendritic projections in high temperature applications was noted by J. Cuomo in his IBM Technical Disclosure Bulletin article in the September, 1975 (Vol. 18, No. 4) issue at pages 1239-40. In this article, tungsten dendrites were employed in a heat pipe application as an inert wicking agent. Dendrites have also been suggested for use as a means of providing an increase in surface area for all modes of heat transfer and, specifically, for populating a chip surface to contact a spherically tipped piston in a chip module. This arrangement is described in the article by S. Oktay et al which appeared in IBM's Technical Disclosure Bulletin in the November, 1977 (Vol. 20, No. 6) issue at page 2218. A further use of dendrites to enhance chip cooling is depicted in the February, 1972 (Vol. 14, No. 9) issue of IBM's Technical Disclosure Bulletin at page 2690 in the article by E. Bakelaar et al. In this arrangement, a plurality of solder ball mounted chips have their exterior surfaces lined with dendritic growth as is the lining of the interior surface of a heat pipe which is positioned about the chips. The dendrites on the chip surface and the heat pipe lining are placed into contact with each other and a dielectric fluid which partially fills the heat pipe thereby improving the capillary action of the dielectric coolant and increasing the cooling action on the chips. It has also been taught by Antonucci et al in the December, 1978 (Vol. 21, No. 7) issue of IBM's Technical Disclosure Bulletin at pages 2910-11, that a controlled growth of dendrites can be utilized to increase the tensile strength and decrease the electrical resistance of the solder ball joint between chip and substrate in a module.

None of the foregoing prior art techniques have, however, proven to be entirely satisfactory. The solder ball technique, for example, is inefficient as an aid in removing heat from the chip because the total cross-sectional area of all such bonds is small compared to the chip's surface area. Most of the heat is removed from the chip by natural convention from its top surface.

Limited improvements in cooling efficiency have been obtained through the use of a fluid or solid heat transfer medium, as described above, but such improvements have been gained at the expense of new packaging problems. The employment of a solid piston, for example, introduced a problem of substrate breakage because of thermal expansion mismatches. The utilization of fluid heat transfer mediums caused problems with respect to migration of the medium, interaction with the module components and/or module sealing problems.

It was postulated that a significant improvement in cost/performance chip heat removal could be obtained by utilizing a heat sink of a highly thermally conductive solid material placed in intimate contact with the chip's back surface. Liquid metal appeared to be a satisfactory choice for this role as it was highly conductive and would deform or flow to intimately contact the chip without undue mechanical pressure being required. Further, liquid metal exhibited superior thermal conductivity than other proposed thermal liquids and greases and was chemically stable. However, under the influence of thermal cycling and mechanical vibration it has been found that the liquid metal, or any other thermal fluid, will migrate from the chip-backbond interface with a resultant decrease in cooling efficiency. It has also been found that the liquid metal will tend to form an outer surface oxide film which reduces its thermal conductivity and, therefore, the chip cooling efficiency.

OBJECTS AND SUMMARY OF THE INVENTION

Accordingly, it is a principal object of the present invention to provide an improved arrangement for enhanced cooling of integrated circuit chips which have been mounted in a packaging module.

It is a more specific object of the present invention to provide such an improved cooling arrangement wherein thermal fluid migration is overcome.

It is a further object of the present invention to provide such an improved cooling arrangement wherein a thermal fluid or medium is non-destructively urged into contact with at least one entire chip surface.

Another object of the present invention is to provide such an improved cooling arrangement wherein chip replacement is simplified.

Yet another object of the present invention is to provide an improved cooling arrangement for integrated circuit chips which is simple to implement and which yields cost/performance improvement over prior techniques and apparatus.

The foregoing and other objects of the present invention are achieved by providing an interfacial layer of liquid metal alloy coated metallic dendrites sandwiched between the back surface of an integrated circuit chip and a heat sink, both mounted in a module container. The heat sink and the interfacial liquid metal layer and dendrites are biased into thermal linkage, by suitable biasing means, with the chip surface to form a unitary heat transfer path of reduced thermal resistance from the chip to the module container.

DESCRIPTION OF THE PREFERRED EMBODIMENT

Figure 1:
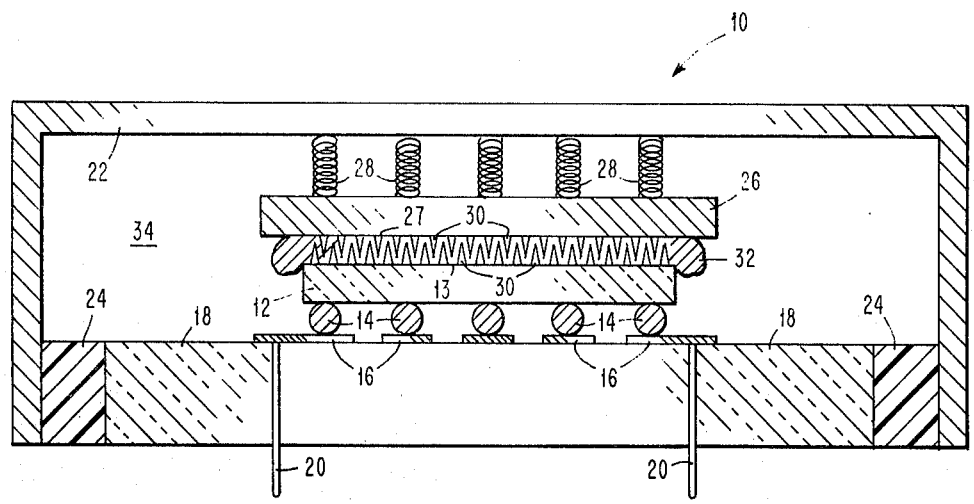
FIG. 1 schematically illustrates a module containing an integrated circuit chip which is to be cooled in operation in accordance with the present invention.

Referring now to the drawings wherein like reference numerals have been used in the several views to identify like elements, FIG. 1 schematically illustrates a chip module 10 arranged in accordance with the present invention. It will be understood by those skilled in the chip packaging art that while only one chip has been shown in FIG. 1 for purposes of simplifying the description of the present invention, it is equally applicable to and satisfactory for use in modules containing a plurality of integrated circuit chips or like devices.

The module 10 includes an integrated circuit chip 12 mounted on a plurality of solder balls 14 which are, in turn, electrically connected to land areas 16. The lands 16 are formed on a ceramic substrate 18 and are connected by pins 20, which extend through the substrate 18, for communication by the chip 12 to the outside world. The module 10 is enclosed by a cap 22, preferably formed of aluminum or other suitable conductive material, which is sealed about the substrate 18 by sealing means 24 to form a hermetically tight package.

There is also provided a solid metal heat sink 26 which is urged downwardly toward the chip 12 by biasing means 28 which can, as illustrated, be a conventional spring or similar device. It should be noted that the biasing means 28 is at least thermally linked between the cap 22 and the heat sink 26 and is formed of a thermally conductive material.

The facing surfaces of the chip 12 and the heat sink 26 are provided with a plurality of metallic dendritic projections 30 which extend therefrom. The dendritic projections 30 are preferably formed by plating them on the chip and heat sink surfaces, 13 and 27 respectively, in the manner described in our commonly assigned, copending U.S. patent application Ser. No. 873,999 which was filed on Jan. 31, 1978, which application is a continuation-in-part of our earlier filed and commonly assigned U.S. patent application Ser. No. 787,804 now abandoned. As set forth therein, dendritic projections can be plated by using a galvanic bath which has a higher than normal current density and a lower than normal metal ion concentration. The specific details of the plating bath can be obtained by consulting these applications, the details of which are incorporated herein by reference. Alternatively, the dendritic projections 30 can be formed by utilizing other techniques such as, for example, chemical vapor deposition. An interfacial layer of liquid metal 32 is provided and placed between the chip 12 and the heat sink 26. The liquid metal layer 32 is preferably a liquid gallium alloy which is totally compatible with other module elements. It has practically zero vapor pressure under any expected service conditions and neither dissolves in or reacts with commonly employed heat transfer fluids, such as helium, nitrogen or a fluorocarbon. Such a heat transfer fluid 34 is used to further enhance the chip cooling and fills the interior spaces of the module 10.

Figure 2:
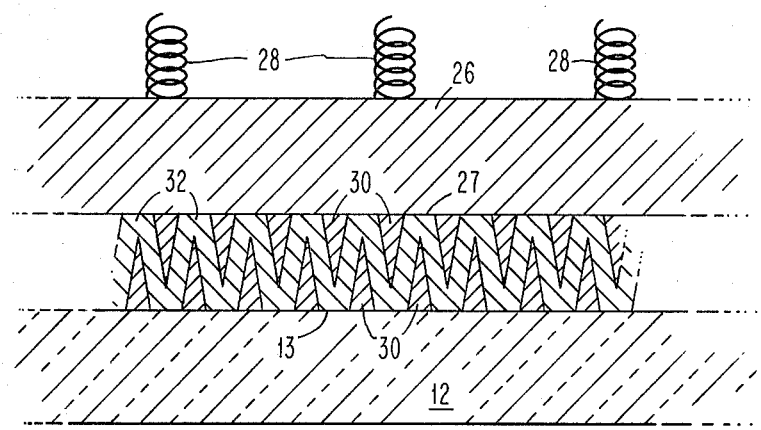
FIG. 2 is a more detailed cross-sectional schematic depiction of the metallic dendritic projections and interfacial liquid metal layer employed in the present invention.

In operation, the chip 12 is mounted in the module 10 as described above and the interfacial layer of liquid metal 32 is then placed on its upper surface 13 on the metallic dendritic projections 30 which extend upwardly therefrom. The cap 22, to which is attached the heat sink 26 and biasing means 28, is then properly positioned and sealed about the substrate 18. When the cap 22 is put in place, it causes the biasing means 28 to urge the heat sink 26 and its downwardly extending dendritic projections 30 into piercing engagement with the liquid metal layer 32. The liquid metal layer 32 is thereby sandwiched between the two sets of dendritic projections 30 and is pierced thereby. The pressure exerted by the biasing means 28 causes the liquid metal to non-destructively fill all the open spaces between the chip 12 and the heat sink 26. The mating of the liquid metal layer 32 and the dendritic projections 30 results in a self-centering action which holds the layer 32 in its intended location during initial engagement and mechanically retains it in place thereafter due to rather strong surface tension forces. In addition, the tendency of liquid metals to develop a surface oxide film which limits thermal conductivity is negated by the presence of the wetted dendritic projections 30 in the liquid metal layer 32 itself. An expanded, schematic illustration of this arrangement of the now liquid metal alloy coated dendritic projections is shown in FIG. 2.

Thus, once the cap 22 is sealed in place and the dendritic projections 30 urged into piercing engagement with the liquid metal layer 32, a unitary heat transfer path is formed which extends from the entire upper chip surface 13, the dendritic projections 30 and interfacial liquid metal layer 32, the heat sink lower surface 27 and the heat sink 26 and biasing means 28 to the module cap 22. This relatively low thermal resistance path promotes heat removal from the chip 12 in an efficient, simple and cost effective manner. Cooling, as noted previously, is supplemented by additional heat transfer to a fluid heat transfer medium 34 which fills the interior of the module 12.

While the present invention has been described in the context of the preferred embodiment thereof, it will be readily apparent to those skilled in the art that modifications and variations can be made therein without departing from the spirit and scope of the present invention. Accordingly, it is not intended that the present invention be limited to or by the specifics of the foregoing description of the preferred embodiment, but rather only by the scope of the invention as defined in the claims appended hereto.

What we claim as our invention and desire to secure by Letters Patent is as follows:

1. Apparatus for enhancing thermal conductivity in and heat removal from a semiconductor integrated chip implemented module, said apparatus comprising:
   (a) a module container formed of a low thermal resistance material;
   (b) a semiconductor chip having a plurality of heat producing microcircuits thereon disposed within said module container, one of said chip surfaces having a plurality of metallic dendritic projections extending therefrom;
   (c) a heat sink, one surface thereof also having a plurality of metallic dendritic projections extending therefrom, said heat sink being disposed within said module so that its dendritic projections are in alignment with and face those of said chip;
   (d) a layer of liquid metal alloy disposed between said facing surfaces of said chip and said heat sink; and
   (e) biasing means, adapted to thermally link said heat sink and said module container, for urging said facing surfaces together so that said respective dendritic projections thereof all pierce said liquid metal alloy layer to form a unitary heat transfer path from said chip to said module container.

2. The apparatus according to claim 1 which further comprises the addition of a fluid heat transfer medium in said module container to enhance chip cooling.

3. The apparatus according to claim 1 wherein said liquid metal layer is a liquid gallium alloy.

4. The apparatus according to claim 1 wherein said biasing means are adapted to urge said facing surfaces together with sufficient force to enable said liquid metal alloy layer to non-destructively fill all available space therebetween.

5. The apparatus according to claim 1 wherein the number of dendritic projections provided respectively on each of said facing surfaces is sufficient to maintain engagement with and retention of said liquid metal alloy layer.

6. The apparatus according to claim 4 wherein the number of dendritic projections provided respectively on each of said facing surfaces is sufficient to maintain engagement with and retention of said liquid metal alloy layer.

* * * * *